(12) United States Patent
Anselm et al.

(10) Patent No.: US 6,265,322 B1
(45) Date of Patent: Jul. 24, 2001

(54) SELECTIVE GROWTH PROCESS FOR GROUP III-NITRIDE-BASED SEMICONDUCTORS

(75) Inventors: Klaus Alexander Anselm, New Providence; Alfred Yi Cho, Summit; Sung-Nee George Chu, Murray Hill, all of NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/399,655

(22) Filed: Sep. 21, 1999

(51) Int. Cl.[7] ........................ H01L 21/302; H01L 21/461
(52) U.S. Cl. ............................................ 438/745; 438/749
(58) Field of Search .................. 117/88, 89, 92, 117/97, 103, 108, 952; 438/47, 94, 745, 757; 372/45; 257/94, 103

(56) References Cited

U.S. PATENT DOCUMENTS

| | | | |
|---|---|---|---|
| 4,946,548 | 8/1990 | Kotaki et al. | 438/718 |
| 5,218,216 | 6/1993 | Manabe et al. | 257/103 |
| 5,247,533 | 9/1993 | Okazaki et al. | 372/45 |
| 5,415,700 * | 5/1995 | Arthur et al. | 136/250 |
| 5,585,648 * | 12/1996 | Tischler | 257/77 |
| 5,604,763 | 2/1997 | Kato et al. | 372/45 |
| 5,683,596 | 11/1997 | Kaneko | 216/83 |
| 5,742,628 * | 4/1998 | Fujii | 372/45 |
| 5,773,369 | 6/1998 | Hu et al. | 438/746 |
| 5,866,925 | 2/1999 | Zolper et al. | 257/279 |
| 5,880,485 | 3/1999 | Marx et al. | 257/94 |
| 5,903,017 | 5/1999 | Itaya et al. | 257/190 |
| 5,915,164 | 6/1999 | Taskar et al. | 438/47 |
| 6,051,849 * | 4/2000 | Davis et al. | 257/103 |
| 6,100,104 * | 8/2000 | Haerle | 438/33 |

OTHER PUBLICATIONS

Adesida, I., Youtsey C., Ping A.T., Khan, F., Romano, LT., Bulman, G. "Dry and Wet Etching for Group III–Nitrides" MRS Internet J. Nitride Semiconductor Res 451, G1.4 (1999).

Bishop S.G., Coleman J.J. "GAN: From Selective Area to Epitaxial Lateral Overgrowth" MRS Internet J. Nitride Semicond. Res. vol. 451, article 64:8 (1999).

* cited by examiner

Primary Examiner—Benjamin L. Utech
Assistant Examiner—Duy-Vu Deo
(74) Attorney, Agent, or Firm—Wendy W. Koba

(57) ABSTRACT

A method of forming selected Group III-nitride regions uses a masking layer to cause differential growth between single crystal Group III-nitride material and polycrystalline Group III-nitride material. The epitaxial process is chosen to provide vertical growth so as to allow for replication of the mask edges at the defined limits for the selected regions. By using an etchant that is selective between polycrystalline and single crystal Group III-nitride material, the polycrystalline material (that grew over the mask layer) can be removed, leaving only the single crystal Group III-nitride (that grew over the exposed substrate material).

10 Claims, 1 Drawing Sheet

SELECTIVE GROWTH PROCESS FOR GROUP III-NITRIDE-BASED SEMICONDUCTORS

TECHNICAL FIELD

The present invention relates to a selective growth technique for Group III-nitride materials and, more particularly, to the use of masking technique to form both polycrystalline and single crystal Group III-nitride films that can be preferentially processed to form selected growth areas.

BACKGROUND OF THE INVENTION

Group III nitrides, in particular, GaN, are of interest for many electronic and optoelectronic applications, including high temperature electronic devices, high-power microwave circuits, blue lasers and LEDs, as well as solar-blind photodetectors. For these applications, the semiconductor layers are grown epitaxially on a crystalline substrate. After the epitaxial growth, a masking layer is typically deposited on the surface and lithographically patterned. The pattern can then be transferred to the underlying semiconductor material by etching. There are several reasons why this patterning is needed, including device isolation, contact to underlying layers, and the formation of waveguides and laser facets.

GaN etching is commonly performed using a reactive ion etching (RIE) technique. An article entitled "Dry and Wet Etching for Group III-nitrides" by I. Adesida et al. appearing in *MRS Internet Journal of Nitride Semiconductor Research*, Vol. 4S1, No. G1.4, 1999, discussed in detail various prior art RIE and wet chemical etching techniques for GaN. One of the drawbacks of reactive ion etching includes the generation of ion-induced damage on the surface of the GaN film. Wet chemical etching produces significantly less damage and is often less costly and complex than RIE systems, thus making wet chemical etching an attractive alternative. However, epitaxial GaN (or Group III-nitrides in general) has been found to be resistant to wet chemical etching. In particular, the etch rates have been too slow for efficient processing. Further, the wet etch techniques have generally not been directional enough to produce sidewalls that mirror the masking material. To circumvent this problem, photo-enhanced electrochemical PPEC) has been developed. U.S. Pat. No. 5,773,369 issued to E. L. Hu et al on Jun. 30, 1998 discussed an exemplary PEC process for Group III nitrides where an ultra-violet light source and a metal mask layer is used. A bias is applied to the metal mask to effect the etch process. In general, a PEC process is ineffective in etching p-type and semi-insulating materials since there are not enough holes at the surface to allow the wet chemistry to progress and etch the material. Regardless of the process used, the etch depth is controlled by several factors, including—among others—the etch time, etch composition and sample temperature.

In some applications, it is desirable to perform an additional growth over already patterned semiconductor layers. With existing etch processes, it is very difficult to pattern any new layer selectively without damaging the previously grown layers. A need remains in the prior art, therefore, for a more controllable method of selectively regrowing and patterning Group III-nitride layers. Selective regrowth would, for example, enable the integration of various GaN-based devices on a single wafer (e.g., electronic devices with lasers or LEDs).

Summary of the Invention

The need remaining in the prior art is addressed by the present invention, which relates to a selective growth technique for Group III-nitride materials and, more particularly, to the use of masking technique to form both polycrystalline and single crystal Group III-nitride (for example, GaN) films that can be preferentially processed to form selected growth areas.

In accordance with the technique of the present invention, a selective growth and etch process is obtained by first depositing, then patterning, a suitable masking layer on a substrate. An epitaxial GaN (for example) film is then grown, using an appropriate process, on the patterned substrate. A single crystal material will form on the exposed substrate, with polycrystalline material forming on the masking layer. An etchant that is selective between the single crystal and polycrystalline material can then be used to remove the polycrystalline film. The remaining masking layer is then removed, leaving only the single crystal GaN material in the selected areas.

In a preferred embodiment of the present invention, the GaN is plasma deposited using a reactive nitrogen species. This process results in the required vertical growth of the GaN film over both the substrate and masking layer. The polycrystalline GaN film will include both N-polar and Ga-polar surfaces, while the single crystal material will exhibit only Ga-polar faces. In order to etch away the polycrystalline material, an etchant such as potassium hydroxide can be used, which is known to etch only the N-polar surface. The single crystal material will remain intact, and the masking layer material can then be removed. The thickness of the patterned, single crystal Ga layer is thus determined precisely by the thickness of the epitaxial growth, and is therefore more controllable than other prior art processes.

Other and further aspects of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
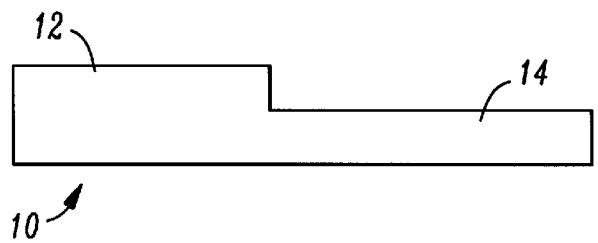
FIG. 1 illustrates an exemplary substrate that may be used in the selective growth process of the present invention.

FIG. 1 illustrates, in a cross-sectional view, an exemplary substrate 10 that can be processed in accordance with the present invention to provide selective growth of a Group III-nitride film. Substrate 10 can comprise a variety of materials, including but not limited to, $Al_2O_3$, SiC and GaN. Further, substrate 10 does not necessarily need to be planar. Indeed, as illustrated in FIG. 1, exemplary substrate 10 is formed to include a first region 12 that is raised above a second region 14. In general, the process of the present invention relates to forming a selective Group III-nitride layer on the exposed surface of substrate 10. For the purposes of the present discussion, the formation of a selective GaN film will be discussed, although it is to be understood that various other Group III-nitrides can similarly be formed.

Figure 2:
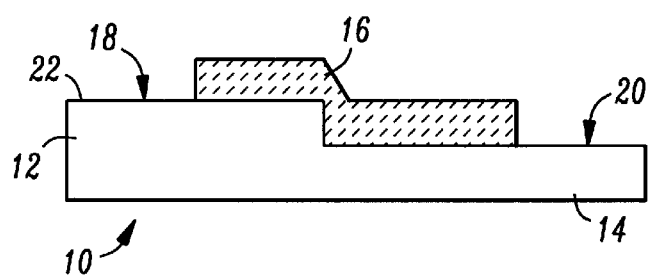
FIG. 2 illustrates the first processing step of the present invention, where a patterned masking layer is formed on the substrate surface.

Referring to FIG. 2, the initial step in the process of the present invention is to form a masking layer 16 that is patterned to leave exposed those areas to be covered with the GaN material. In the exemplary arrangement as shown in FIG. 2, masking layer 16 is patterned to leave exposed a first surface area 18 (in region 12) and a second surface area 20 (in region 14). Any other suitable pattern can be used. In accordance with the present invention, the material used to form masking layer 16 is very important. In particular, the mask material must be stable at the temperatures used for epitaxial growth (e.g., temperatures in the range of 600° C. to 900° C.), and should not decompose or contaminate the epitaxial growth chamber. A preferred embodiment of the present invention utilizes conventional silicon dioxide as the masking material (other materials, for example, silicon nitride, may be used in the formation of the masking layer). In a conventional method of applying the masking layer, a uniform film of silicon dioxide is first disposed to completely cover the surface 22 of substrate 10. Silicon dioxide masking layer 16 is then patterned to expose regions 18 and 20, as shown in FIG. 2.

Subsequent to the patterning of masking layer 16, an epitaxial layer of the Group III-nitride (for example, GaN) is grown to cover the exposed surface. In accordance with the present invention, the technique used to grow the epitaxial layer is extremely important. For example, some techniques, such as metal-organic chemical vapor deposition (MOCVD) and chemical beam epitaxy (CBE) rely on the substrate surface to help crack the nitrogen precursor so as to form the active nitrogen needed for growth. Therefore, depending on the growth conditions, GaN grown by these techniques may not deposit directly on the surface of masking layer 16. Indeed, GaN may grow laterally from the sides of the mask and, while laterally grown material is often of high quality, it prevents the vertical transfer of the mask pattern to the substrate, a necessary requirement of the selective process of the present invention. In accordance with the present invention, therefore, vertical growth of the epitaxial film is required in order to replicate the mask dimensions onto the substrate surface. One exemplary way to accomplish vertical growth is to use a reactive nitrogen species, such as that provided by a plasma source. Therefore, in accordance with the present invention, a plasma-deposited GaN film is preferred. It is to be understood, however, that any GaN growth technique capable of providing the necessary vertical growth may be used in accordance with the present invention.

Figure 3:
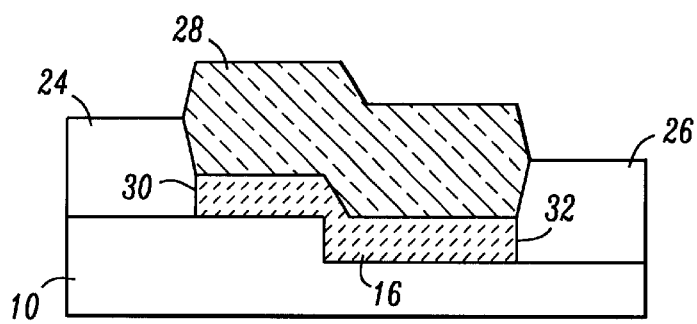
FIG. 3 illustrates a subsequent step in the process of the present invention, subsequent to the epitaxial growth of a Group III-nitride (such as GaN) over both the exposed substrate and masking layer.
Figure 4:
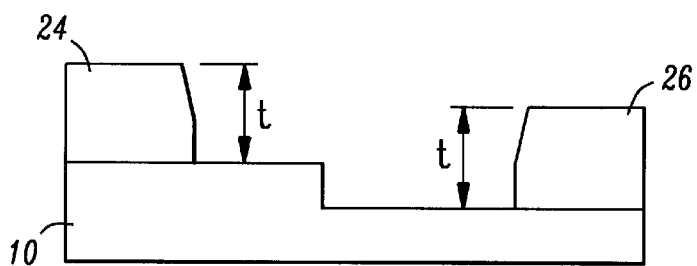
FIG. 4 illustrates the final selected growth structure formed in accordance with the present invention, where the polycrystalline material and associated masking layer have been removed.

FIG. 3 illustrates the structure of the present invention subsequent to forming a GaN layer using a plasma process with a reactive nitrogen species. Referring to FIG. 3, the use of a reactive nitrogen species results in the formation of a single-crystalline GaN semiconductor growth 24 and 26 over substrate-exposed regions 18 and 20, respectively. Importantly, the use of a reactive nitrogen species results in the growth of a polycrystalline GaN material 28 over masking layer 16. Both regions, as a result of the plasma process, are vertical growth regions, allowing for the precise transfer of edges 30,32 of masking layer 16 onto underlying substrate 10 (as shown in FIG. 4 and discussed in detail below).

In accordance with the present invention, the formation of selected growth GaN regions is then accomplished by removing (by etching) both the polycrystalline GaN and the underlying masking layer. The results of this etch step are shown in FIG. 4, which illustrates the selected, single crystal GaN regions 24 and 26 on substrate 10. An important step in the process of the present invention relates to the selection of an etchant that will preferentially etch polycrystalline GaN with respect to single crystal GaN. As is well known, the chemical resistance of GaN depends strongly on the crystallographic plane of the material. In particular, there are no known chemicals that will etch a defect-free Ga-polar GaN surface (unless assisted by ultraviolet light or reactive ions, as described above). The N-polar surface, which is the face opposite the Ga-polar plane, can be etched, for example, by solutions of potassium hydroxide (or other etchants, such as sodium hydroxide or ammonium hydroxide). Therefore, when the structure as shown in FIG. 3 is immersed in an etchant that etches only the N-polar surface (such as potassium hydroxide), only polycrystalline GaN 28 will be removed, since only this material has exposed N-polar surfaces. Single crystal GaN (having only Ga-polar surfaces) will remain intact during the etching operation. Subsequent to the etching of polycrystalline GaN 28, masking layer 26 can then be removed using any conventional etch that is selective between GaN and the masking material (such as hydrofluoric acid). The remaining structure, as illustrated in FIG. 4, thus includes "selective", single crystal GaN regions 24,26, where the thickness "t" of each region is determined precisely by the thickness of the epitaxial growth, and is therefore more controllable than the prior art non-selective growth processes discussed above.

Although the present invention has been described in connection with preferred embodiments in terms of, for example, certain materials for each layer and certain etchants for each step, it should be noted that various changes and modifications can be made and are apparent to those skilled in the art. Accordingly, such changes and modifications so far as encompassed by the appended claims are to be understood as included within the scope of the present invention.

What is claimed is:

1. A method for selectively forming Group III-nitrides on selected substrate areas, the method comprising the steps of:
   a) providing a substrate of material compatible with the growth of a Group-III-nitride layer;
   b) masking said substrate with a layer of masking material so as to leave exposed those areas of said substrate selected for growth of a Group III-nitride layer;
   c) epitaxially growing a Group III-nitride layer over the structure formed in step b) using an epitaxial process that yields vertical growth, the epitaxial material grown over the masking layer being polycrystalline with both Group III-polar crystal surfaces and N-polar crystal surfaces and the epitaxial material grown over the substrate being single crystal with Group III-polar crystal surfaces;
   d) etching the epitaxial Group III-nitride material with an etchant that selectively removes the N-polar crystal surfaces of the polycrystalline material with respect to the Group III-polar single crystal material; and
   e) removing the masking layer of step b).

2. The method as defined in claim 1 wherein the Group III-nitride comprises GaN.

3. The method as defined in claim 1 wherein in performing step a), the substrate material is chosen from the group consisting of $Al_2O_3$, SiC and GaN.

4. The method as defined in claim 3 wherein in performing step a), the substrate material comprises GaN.

5. The method as defined in claim 1 wherein in performing step a), a planar substrate is provided.

6. The method as defined in claim 1 wherein in performing step a), a non-planar substrate is provided.

7. The method as defined in claim 1 wherein in performing step b), silicon dioxide is used as the masking material.

8. The method as defined in claim 1 wherein in performing step c), a reactive nitrogen plasma process is used to generate the vertical epitaxial growth.

9. The method as defined in claim 1 wherein in performing step d), potassium hydroxide is used as the etchant.

10. The method as defined in claim 1 wherein in performing step e), hydrofluoric acid is used to remove the masking layer.

\* \* \* \* \*